United States Patent [19]

Devico et al.

[11] Patent Number: 4,517,752

[45] Date of Patent: May 21, 1985

[54] SPLASH RETARDER

[75] Inventors: Michael J. Devico, Madison; Gary Hillman, Livingston, both of N.J.

[73] Assignee: Machine Technology, Inc., Whippany, N.J.

[21] Appl. No.: 507,927

[22] Filed: Jun. 27, 1983

[51] Int. Cl.$^3$ ............................................. F26B 17/24
[52] U.S. Cl. .......................................... 34/58; 34/8; 34/52
[58] Field of Search ............................ 34/4, 8, 55, 58; 494/52; 134/1

[56] References Cited

U.S. PATENT DOCUMENTS

| | | | |
|---|---|---|---|
| 1,903,174 | 3/1933 | Ferguson | 34/58 |
| 3,742,611 | 7/1973 | Koller | 34/8 |
| 3,861,584 | 1/1975 | Dudrey | 494/52 |
| 3,920,181 | 11/1975 | Lega et al. | 494/52 |
| 4,087,924 | 5/1978 | Fujimoro et al. | 34/58 |
| 4,281,031 | 7/1981 | Hillman et al. | 134/1 |
| 4,350,282 | 9/1982 | Dudrey et al. | 494/52 |
| 4,445,281 | 5/1984 | Aigoo | 34/58 |

FOREIGN PATENT DOCUMENTS 16875  2/1977  Japan ..................................... 34/58

*Primary Examiner*—Edward G. Favors
*Assistant Examiner*—Steven E. Warner
*Attorney, Agent, or Firm*—Lerner, David, Littenberg, Krumholz & Mentlik

[57] ABSTRACT

An apparatus and method for retarding splashback of liquids collected from a rotating workpiece is disclosed. In accordance with the apparatus, there is provided a work station upon which a workpiece, such as a semiconductor wafer, is positioned, a collecting means for collecting liquids discharged from the workpiece by rotation of the work station and a means for rotating the collecting means. Also in accordance with the present invention, the collecting means may be rotated separately from the work station but in the same direction as the work station. In accordance with the method, there is provided applying liquids to the workpiece, rotating work station with the workpiece positioned on it and rotating a collecting means in the same direction as the work station. Also in accordance with the invention, the apparatus may be combined with apparatus for a segregated drainage of first and second liquids such that splashback during collection of these liquids will be retarded.

20 Claims, 6 Drawing Figures

SPLASH RETARDER

BACKGROUND OF THE INVENTION

1. Field of the Invention

The present invention relates generally to an apparatus and method for retarding the splash of liquids discharged from a rotating workpiece and specifically to an apparatus and method for retarding the splash back of liquids collected from a rotating silicon wafer during the performance of processes upon the silicon wafer.

In the processing of semiconductor materials for the manufacture of integrated circuits and the like, a number of separate processes must be performed on the silicon wafers. Reference is made to U.S. Pat. No. 4,281,031 in which such different processing steps are set out. Typically, the various processing steps for silicon wafers involve the application of different liquids to the silicon wafer during which different types of waste liquids are generated. It is desirable during the processing of silicon wafers to have the waste liquids being generated continuously drained away from the silicon wafer and collected. This includes certain caustic waste fluids which must be drained from the silicon wafer. By rotating the silicon wafer waste, liquids will be discharged from the silicon wafer by centrifugal force. These waste liquids may be collected by a collection means which provides a solid surface against which the discharged waste liquids are captured and drained away. Upon contact with the collection means the force of the discharged waste liquids which is not absorbed by the collection means will cause a splashback effect whereby some of the waste liquids will splash away from the collection means and often be directed back towards the silicon wafer. In this way, waste liquids will not be efficiently collected and may interfere with the processing of the silicon wafer. It is therefore highly desirable to provide an apparatus whereby the waste liquids discharged from the rotating silicon wafer may be collected and drained away with a minimal amount of splash back.

2. Description of the Prior Art

The prior art discloses apparatus which use cup-shaped drains to collect liquids discharged radially from a rotating workpiece. However, no prior art reference discloses use of a rotating collection means to retard the splash of the fluids being collected. U.S. Pat. No. 4,281,031 provides a fixed cup-shaped drainage mechanism for collecting fluids discharged from a rotating workpiece. The drain is not rotated.

In other unrelated fields, this problem has also not been solved. U.S. Pat. No. 3,327,401 discloses a cup-shaped drain against which moisture discharged from rotating material is collected and drained. As for the prior reference, this cup-shaped drain is not rotated. U.S. Pat. No. 3,945,921 discloses a rotary centrifugal machine in which moisture is discharged by centrifugal force to the fixed wall of a cup-shaped drain. The present invention is distinguishable over these references by disclosing a collection means for liquids discharged from a rotating workpiece which collection means is rotated to retard splash.

SUMMARY OF THE INVENTION

It is an object of the present invention that splash will be retarded during the collection of waste liquid discharged from a rotating workpiece. More particularly, waste liquid being discharged by centrifugal force from a rotating workpiece has two force vectors, one in the direction radially from the workpiece and the other at an angle 90° from the first in the direction of the rotation of the workpiece. The amount of splashback caused during the collection of the waste liquid will depend upon the degree to which the collection means is able to nullify these two force vectors. A fixed collection means provides no effective way of cancelling any impact of the force vector of the waste liquid in the direction of the rotation of the workpiece. The present invention by rotating the collection means in the same direction as the workpiece creates a force vector in the direction opposite of the rotation of the workpiece which will dampen the force vector of the waste liquid in the direction of the rotation of the workpiece upon contact with the collection means.

It is a further object of the present invention to provide a method for continuously draining waste liquids from a silicon wafer during the performance of processes upon the wafer without significant splashback of the waste liquids to the silicon wafer.

It is also an object of the present invention to provide a means for retarding the splashback from the collection of waste liquids during the processes upon a silicon wafer where the collection means used may be a cup-shaped member for collection. It is yet a further object of the present invention to provide an arrangement for retarding splash during the collection of waste liquids from a silicon wafer during the performance of processes upon it without the need for costly apparatus to collect and drain the waste liquids discharged from the silicon wafer.

In a preferred embodiment, the present invention provides an apparatus for retarding the splash of liquids discharged from a rotating workpiece, comprising a work station upon which a workpiece may be positioned, collecting means for collecting fluids or materials discharged from the workpiece and rotating means for rotating both the work station and the collecting means in the same direction whereby the splash of fluid and material from the collecting means is retarded. The speed of which the collecting means is rotated relative to the speed of the rotation of the workpiece may affect the degree to which splash of the liquids is retarded. Thus, it should be understood that one of ordinary skill in the art may arrive at different speeds at which to rotate the collection means relative to the workpiece in order to accomplish a different splash back result for the waste liquids. But, the present invention should be construed to cover the rotation of the collection means in the same direction as the workpiece at any speed.

In another preferred embodiment, the present invention provides a method of retarding the splash of liquids discharged from a rotating workpiece positioned at a work station towards a collecting means, which comprises applying liquids to the workpiece at the workpiece station and simultaneously rotating the work station and collecting means in the same direction. In this embodiment, the collecting means may be rotated at a speed at least as fast as the rotation of the work station. The rotation of the work station and the collecting means may be effected by one or more motor means for rotating.

In yet another preferred embodiment, the present invention provides an apparatus for retarding the splash of first and second liquids being separately collected during the performance of first and second processes upon a workpiece, which comprises a work station at which first and second processes are performed on a workpiece, first collection means for collecting first liquid generated during the performance of first process upon the workpiece, second collection means for collecting second liquid generated during the performance of second process upon the workpiece, rotating means for rotating the work station and first and second collection means and directing means for directing first liquid to first collection means during the performance of first process and second liquid to second collection means during the performance of second process. This preferred embodiment may also include first drain for the drainage of first liquid and second drain for the drainage of second liquid. The rotating means may include means for rotating the first and second collection means in the same direction as the work station and at a speed at least as fast as the work station. The first and second collection means may include first and second cup-like members having a base and circumferential wall portion. The first and second collection means may be concentrically disposed about the work station. The rotating means may include a single rotating means for the work station and first and second collection means; first rotating means for the work station and second rotating means for the first and second collection means; or first rotating means for the work station, second rotating means for first collection means and third rotating means for second collection means. The various rotating means may include motor means for rotating the work station and/or the collection means.

It should be understood that the present invention will operate for either liquids or solid material being discharged from a rotating workpiece or any type of rotating station. It should also be understood that the present invention is not to be limited to the environment of the processing of semiconductor materials, but may be used widely in other environments. The environment of processing of semiconductor materials is provided for illustration purposes only.

BRIEF DESCRIPTION OF THE DRAWINGS

Further objects, features, and advantages of the present invention will become apparent upon consideration of the following detailed description of the presently preferred embodiments when taken in conjunction with the accompanying drawings, wherein.

DETAILED DISCUSSION OF PREFERRED EMBODIMENTS OF THE PRESENT INVENTION

Figure 1:
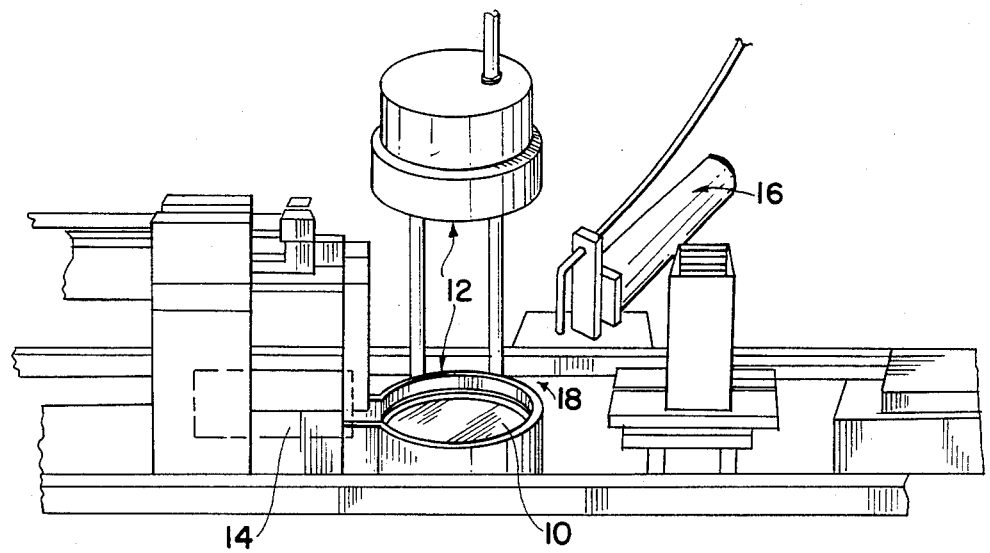
FIG. 1 is a perspective view illustrating the plurality of different types of processing apparatus which may be used for performance of processes upon a silicon wafer.

Referring now to FIG. 1, there is shown the general environment of the present invention, which was disclosed in U.S. Pat. No. 4,281,031. FIG. 1 includes a work support station or vacuum chuck designated by the reference numberal 10, microwave baking apparatus 12, wafer-scrubbing apparatus 14, dispensing apparatus 16, and liquid collection and drainage apparatus 18. The apparatus shown in FIG. 1 are typically used in the processing of silicon wafers and other apparatus may be used which are known in the art.

Figure 2:
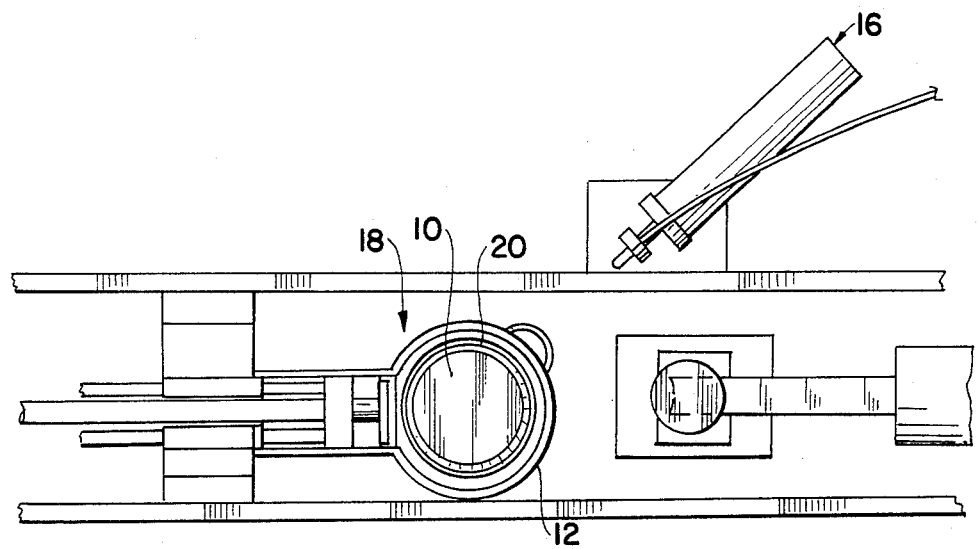
FIG. 2 is a plan view of the apparatus illustrated in FIG. 1.

Referring to FIG. 2, the liquid collection and drainage apparatus 18 of the present invention is shown to include a cup-shaped member 20 disposed around the chuck 10. At stages during the performance of processes upon the silicon wafer positioned on the vacuum chuck 10, liquids are dispensed on the silicon wafer from the dispensing apparatus 16, after or during which the chuck 10 is rotated to discharge waste liquid and materials from the silicon wafer to the inner walls of the cup-shaped member 20.

Figure 3:
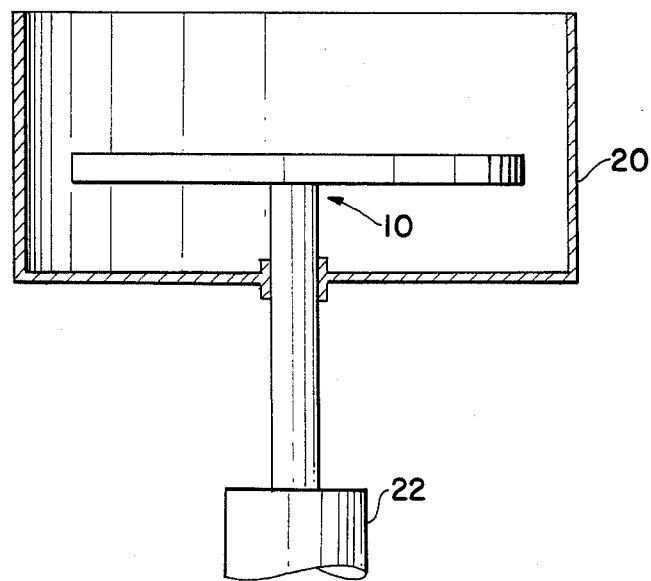
FIG. 3 is a detailed view of the preferred embodiment of apparatus and method for retarding splash which includes the collection means fixed to the chuck supporting the work station.

Referring now to FIG. 3, there is shown the apparatus of the present invention in a preferred embodiment, which includes the chuck 10, the cup-shaped member 20 which is attached to the chuck and a motor 22 which is used to rotate the chuck 10 and the cup-shaped member 20. As shown in FIG. 3, when the motor 22 rotates the chuck 10 during the performance of processes upon the silicon wafer positioned on the chuck, liquids and materials applied to the silicon wafer will be discharged by centrifugal force to the inner wall of the cup-shaped member 20. During this operation the cup-shaped member 20 will be rotated at the same speed as the chuck 10 with the result that splash will be retarded of liquids being discharged radially from the silicon wafer on the rotating chuck 10.

Figure 4:
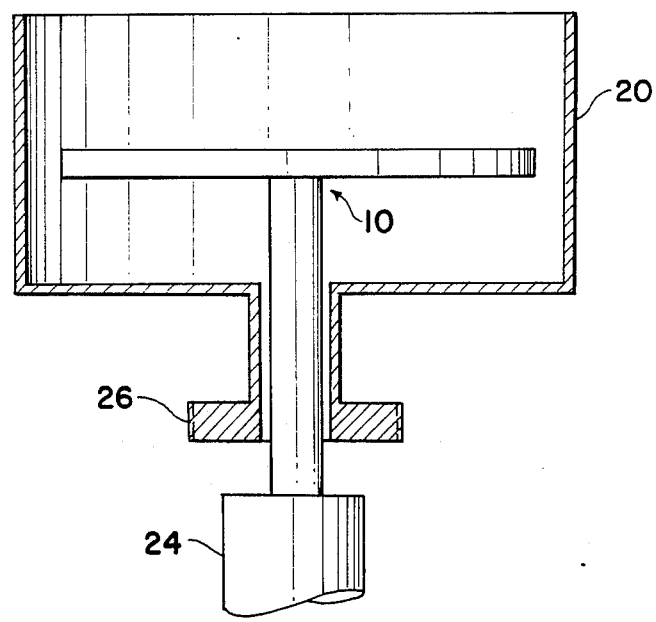
FIG. 4 is a detailed view of the preferred embodiment of the apparatus and method for retarding splash which includes a separately movable collection means.

Referring now to FIG. 4, there is shown the apparatus of the present invention in a second preferred embodiment, which includes the chuck 10, the cup-shaped member 20 which is positioned free from the chuck 10, a motor 24 which may be used to rotate the chuck 10 and a motor 26 which may be used to rotate the cup-shaped member 20. As shown in FIG. 4, the chuck will be rotated by the motor 24 and the cup-shaped member will be rotated by the motor 26, so that the cup-shaped member 20 may be rotated at a different rate of speed than the chuck 10.

Figure 5:
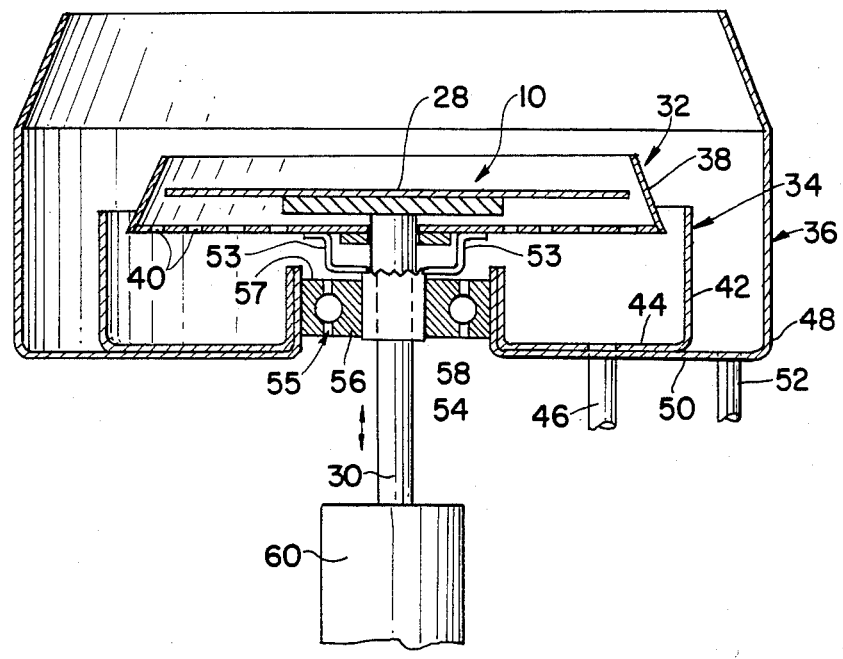
FIG. 5 is a detailed view of the preferred embodiment of the apparatus and method for retarding splash in combination with apparatus for segregating the drainage of a first and second liquid.

Referring now to FIG. 5, there is shown the apparatus of the present invention in combination with a co-filed invention relating to the segregated drain system. FIG. 5 includes a vacuum chuck 10 which comprises a chuck face portion 28 and a shaft portion 30, a first collection means 32 which is positioned about the vacuum chuck 10, and a drain means 34 and a second collection means 36, all positioned concentrically to the chuck 10 with the drain means 32 and the drain means 34 being nearer to the chuck 10 than the second collection means 36. The first collection means 32 includes a circumferential wall portion 38 and a base portion 40 which contains holes to permit drainage of liquid through the base. The drain means 34 includes a circumferential wall portion 42, a base portion 44 and a drain 46 leading from the base portion 44. The second collection means 36 includes a circumferential wall portion 48, a base portion 50 and drain 52 leading from the base portion 50. The base 40 of the first collection means 32 is connected by means of armatures 53 to a collar 54 disposed about and free of the shaft 30. Between the collar 54 and the base 50 of the second collection means 36 is a bearing attachment 55 which includes an inner race 56 which contacts the shaft 30 and an outer race 57 which contacts the base portions 44 and 50 of the first liquid collection means 34 and the second liquid collection means 36. Positioned between the face portion 28 of the chuck 10 and the collar 54 is a gear 58 by which the vacuum chuck 10 may be fixed to the collar 54 when the vacuum chuck is lowered so that the teeth of the gear 58 meet and the vacuum chuck is free of the collar 54 when the vacuum chuck is elevated so that the teeth of the gear 58 do not meet. A drive mechanism 60 such as a motor is shown whereby the chuck 10 may be rotated and lowered or elevated.

Figure 6:
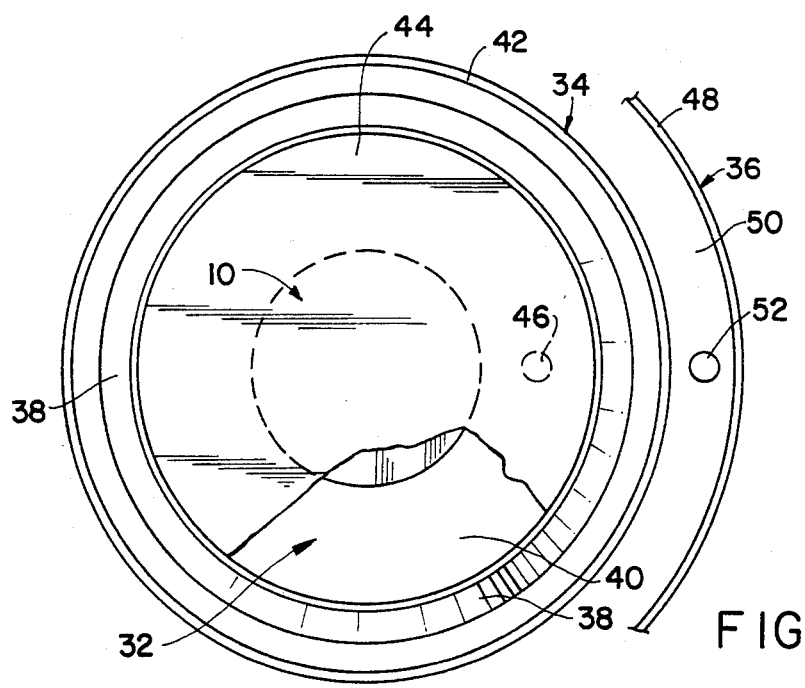
FIG. 6 is a plan view of the apparatus illustrated in FIG. 5.

Referring now to FIG. 6, there is shown a plan view of the apparatus as shown in FIG. 5 which includes a vacuum chuck 10, the first collection means 32 positioned about the vacuum chuck 10 which comprises a circumferential wall portion 38 and a base portion 40, a drain means 34 positioned concentrically to the chuck 10 which comprises a circumferential wall portion 42, a base portion 44 and drain 46, a second collection means 36 positioned concentrically to the chuck 10 and the first collection means 32 which comprises a circumferential wall portion 48, a base portion 50 and drain 52.

We claim:

1. Splash-retarding apparatus, comprising a rotatable work station upon which a workpiece may be positioned, collecting means for collecting liquid discharged from a workpiece positioned on said work station, said collecting means includes a solid circumferential wall portion surrounding said work station so as to capture liquid discharged by centrifugal force from a workpiece positioned on said work station upon rotation of said work station, and rotating means for rotating said work station such that liquid on a workpiece positioned on said work station is discharged by centrifugal force toward said circumferential wall portion of said collecting means and for simultaneously rotating said collecting means in the same direction as said work station, whereby the splash of liquid impacting on said circumferential wall portion of said collecting means after its discharge from a workpiece on said work station is retarded.

2. Apparatus in accordance with claim 1, wherein said rotating means includes means for rotating said collecting means in the said direction and at a speed at least as fast as the rotation of said work station.

3. Apparatus in accordance with claim 1, wherein said apparatus includes a drain.

4. Apparatus in accordance with claim 1, wherein said collecting means includes a cup-like member having a base which is surrounded by said circumferential wall portion.

5. Apparatus in accordance with claim 4, wherein said collecting means is concentrically disposed about said work station.

6. Apparatus in accordance with claim 1, wherein said rotating means includes first means for rotating said work station and second means for rotating said collecting means.

7. Apparatus in accordance with claim 1, wherein said rotating means includes motor means for rotating said work station and said collecting means.

8. Apparatus in accordance with claim 6, wherein said first and second rotating means includes first and second motor means for rotating said work station and said collecting means.

9. Splash-retarding apparatus, comprising a rotatable work station at which first and second processes are individually and sequentially performed on a workpiece, first collection means for collecting liquid generated during the performance of said first process upon a workpiece positioned on said work station, said first collection means including a solid circumferential wall portion arranged coaxially with respect to said work station, second collection means for collecting liquid generated during the performance of said second process upon a workpiece positioned on said work station, said second collection means includes a solid circumferential wall portion arranged coaxially with respect to said work station, moving means for axially moving said work station relative to said first collection means between a first position in which liquid generated during the performance of said first process is discharged by centrifugal force against said circumferential wall portion of said first collection means and a second position in which liquid generated during the performance of said second process is discharged by centrifugal force against said circumferential wall portion of said second collection means, whereby liquids generated during the performance of said first and second processes are collected separately by said first and second collection means, respectively, and rotating means for rotating said work station such that liquid contained on a workpiece positioned on said work station is discharged by centrifugal force toward said circumferential wall portions of said first and second collection means, for rotating said first collection means simultaneously with the work station in the same direction as said work station when said work station is in said first position, whereby the splash of liquid generated during the performance of said first process and impacting on said circumferential wall portion of said first collection means after its discharge from a workpiece on said work station is retarded, and for rotating said second collection means simultaneously with said work station in the same direction as said work station when said work station is in said second position, whereby the splash of liquid generated during the performance of said second process and impacting on said circumferential wall portion of said second collection means after its discharge from a workpiece on said work station is retarded.

10. Apparatus in accordance with claim 9, wherein said apparatus includes a drain.

11. Apparatus in accordance with claim 9, wherein said apparatus includes a first drain for draining liquid generated during the performance of said first process and a second drain for draining liquid generated during the performance of said second process.

12. Apparatus in accordance with claim 9, wherein said first and second collection means include first and second cup-like members, said first cup-like member having a base which is surrounded by said circumferential wall portion of said first collection means, and said second cup-like member having a base which is surrounded by said circumferential wall portion of said second collection means.

13. Apparatus in accordance with claim 9, wherein said first and second collection means are concentrically disposed about said work station.

14. Apparatus in accordance with claim 9, wherein said rotating means includes first rotating means for rotating said work station and second rotating means for rotating said first and second collection means.

15. Apparatus in accordance with claim 9, wherein said rotating means includes first means for rotating said work station, second means for rotating said first collection means and third means for rotating said second collection means.

16. Apparatus in accordance with claim 9, wherein said rotating means includes motor means for rotating said work station and said first and second collection means.

17. Apparatus in accordance with claim 14, wherein said first and second rotating means include first and second motor means for rotating said work station and said first and second collection means, respectively.

18. Apparatus in accordance with claim 15, wherein said first, second and third rotating means include first, second and third motor means for rotating said work station, said first collection means and said second collection means, respectively.

19. Apparatus for retarding the splash of first and second liquids separately collected during the performance of first and second processes upon a workpiece at a work station, said apparatus comprising a work station at which said first and second processes are performed on said workpiece, first collection means for collecting said first liquid generated during the performance of said first process upon said workpiece, second collection means for collecting said second liquid generated during the performance of said second process upon said workpiece, rotating means for rotating said work station and said first and second collection means, said rotating means includes first means for rotating said work station, second means for rotating said first collection means and third means for rotating said second collection means, and directing means for directing said first liquid to said first collection means during the performance of said first process and said second liquid to said second collection means during the performance of said second process, whereby said first and second liquids may be separately collected and the splash of said liquids against said first and second collection means is retarded.

20. Apparatus in accordance with claim 19, wherein said first, second and third rotating means includes first, second and third motor means, respectively, for rotating said work station, said first collection means and said second collection means, respectively.

* * * * *